United States Patent [19]

Wakat, Jr. et al.

[11] 4,334,343

[45] Jun. 15, 1982

[54] METHOD OF MAKING CRYSTAL MOUNTING AND CONNECTION ARRANGEMENT

[75] Inventors: Emory Wakat, Jr., Plantation; Lawrence N. Dworsky, Coral Springs; Leo V. Krolak, Plantation; Jeffery A. Whalin, Palm Springs, all of Fla.; Harold W. Mech, Bloomingdale, Ill.

[73] Assignee: Motorola Inc., Schaumburg, Ill.

[21] Appl. No.: 180,761

[22] Filed: Aug. 25, 1980

Related U.S. Application Data

[62] Division of Ser. No. 33,774, Apr. 27, 1979, Pat. No. 4,282,454.

[51] Int. Cl.³ .................................................. H01L 41/22
[52] U.S. Cl. ...................................... 29/25.35; 29/860; 228/179
[58] Field of Search ............... 29/25.35, 860; 310/348, 310/351–353; 228/179, 4.5

[56] References Cited

U.S. PATENT DOCUMENTS 3,448,437  6/1969  Barnett ............................ 310/366 X
4,142,288  3/1979  Flammer et al. ................. 228/4.5 X Primary Examiner—Carl E. Hall
Attorney, Agent, or Firm—Margaret Marsh Parker; James S. Pristelski; James W. Gillman

[57] ABSTRACT

A crystal is mounted on a low, centrally located pedestal. Connections to the lower side of the crystal are made by way of conductive areas on the pedestal. Multiple wiring connections are made at the edges of the crystal by allowing the bonding tool to depress the edge of the crystal so that the crystal bonding pad is supported by the base structure only during the bonding process, then released thereafter to allow free vibration of the crystal plate. Complex circuitry, possibly involving more than one frequency can thus be put onto one plate.

3 Claims, 5 Drawing Figures

METHOD OF MAKING CRYSTAL MOUNTING AND CONNECTION ARRANGEMENT

This is a division of application Ser. No. 033,774, filed Apr. 27, 1979, now U.S. Pat. No. 4,282,454.

BACKGROUND OF THE INVENTION

This invention relates to the field of techniques for mounting and making connections to piezoelectric crystals.

Thin crystal blanks, formed by slicing an artificially grown crystal having the desired electrical characteristics, have typically been mounted at the edges in order to provide a large surface area which is free to vibrate. Since techniques have now been developed for putting relatively complex circuitry on a single crystal, edge-mounting has proven to be less desirable. Crystal mountings are known which support the crystal on a conductive support usually at the center, with the second contact made directly opposite by a second support post or by a soldered wire.

Simple opposing supports are, of course, not possible for more complex circuitry, since the requisite multiple contacts must be separated by as much distance as possible on a small crystal. This is mainly because separate portions of the circuitry may well be operating at different frequencies and interference must therefore be minimized.

In the case of multiple contacts, a problem arises when wire bonds are made to portions of the crystal which are unsupported; i.e., not opposite the support member, and the rate of crystal breakage therefore becomes excessively high. These areas, however, cannot be supported during operation of the crystal in an electronic circuit, since the ensuing amount of acoustic damping would be unacceptable.

SUMMARY OF THE INVENTION

It is therefore an object of the present invention to provide a means of mounting the crystal with one central support area, with all other electrical contacts made at the edges, providing maximum shock and stress resistance.

It is another object to provide support for the edges of the crystal at the wire bonding sites only during the bonding process.

These objects and others which will become apparent hereinafter are achieved in a device in accordance with the present invention wherein a crystal plate is supported on an insulating base by means of a small, very low pedestal. The crystal vibrates in the coupled modes of thickness shear and thickness twist, with cooperating pairs of electrodes on opposite surfaces of the crystal plate. Ground or reference electrodes on the lower surface are connected via one or more conductive areas on the pedestal to one or more areas on the base. Electrodes on the upper surface of the plate are connected to bonding pads near the edges of the plate. Wire bonds are made by attaching one end of each wire bond to a pad on the base in the known manner. The second end of each wire is attached by causing the bonding tool to deform the plate, bending a portion of the plate edge down to physically contact the base before the second bonding takes place. After the second bonding is complete, the tool lifts and the plate resumes planar form.

DETAILED DESCRIPTION OF A PREFERRED EMBODIMENT

Figure 1:
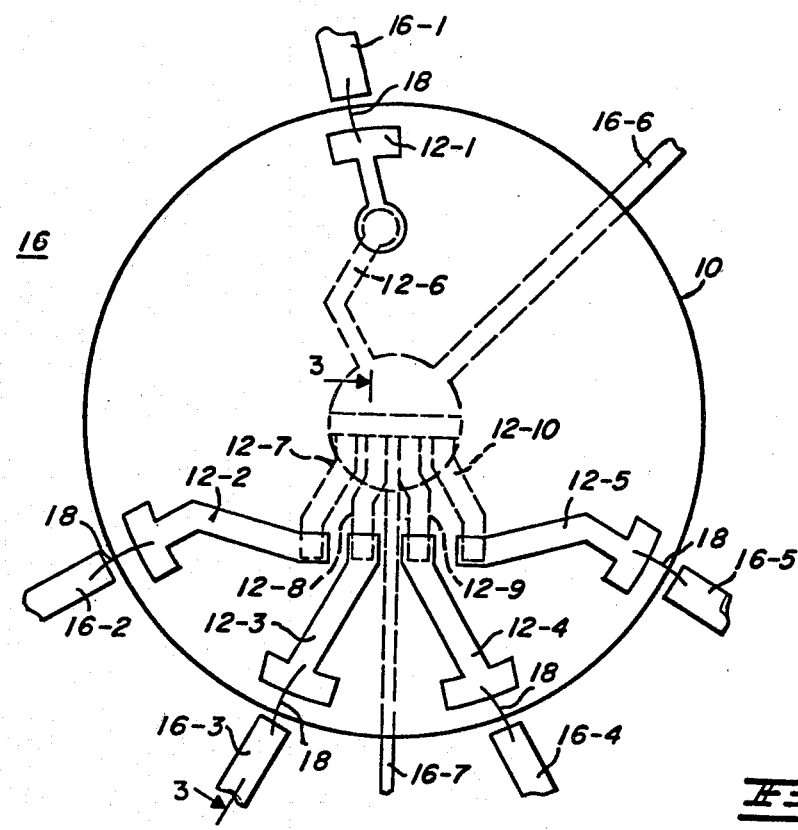
FIG. 1 is a top view of one embodiment of the crystal structure.

In FIG. 1 a complete structure is shown with a crystal 10 having a multiplicity of conductive areas 12 formed thereon. The crystal could have been formed in any known manner, but is preferably a very thin AT-cut plate of an artificialy grown crystal such as quartz. The conductive areas are preferably formed by deposition of a metal such as gold or aluminum. The crystal 10 is shown mounted on a small, very low pedestal 13 (see FIGS. 2-5) on a substrate 16. Connection pads 16-1 to 16-7 on the substrate 16 may be formed by thin or thick film deposition or by electroplating. Conductive areas 12-1 to 12-5 on the top surface of the crystal 10 are coupled to the pads 16-1 to 16-5 by wire bonds 18 as will be described hereinbelow. Usable crystal 10 dimensions would be 250 mils (0.64 cm) diameter and 2 mils (0.005 cm) thick. Actual dimensions are a factor of the desired operating frequencies and the elastic limit of the crystal plate 10. The pedestal 13 might then be of the order of 1.5 to 2.5 mil (0.004 to 0.006 cm) high and 60 mils (0.13 cm) wide, preferably circular. As a rule of thumb, the free-running frequency in megahertz of such a crystal plate will be 66 times the thickness in mils times the overtone number for operation in a thickness mode of vibration. The mass (shape and thickness) of the electrodes will then load the various areas of the crystal to the exact desired frequencies. The electrodes are spaced as far as possible from both the crystal edge and the pedestal since both are lossy. The bonding wire may be 1 mil or 0.0025 cm in thickness.

It is both possible and desirable to provide a resonator and a resonator filter on one crystal blank, saving both costs and space. The circuit elements include pairs of conductive areas capacitively coupled through the crystal plate and acoustically coupled to each other through the crystal. Such circuitry obviously requires additional contacts or terminal points, and the filter elements should be placed as far from the resonator elements as possible if the elements are to operate at different frequencies. The operating frequencies are generally dependent on the crystal dimensions, but the precise frequencies are a function of parameters such as the mass of the opposing electrode portions of the conductive areas. Each separate circuit has a ground or reference terminal in the center of the lower surface of the blank, each connected to a separate conductive element on the support structure.

The conductive areas on the upper surface of the crystal may be a single resonator element 12-1 and resonator filter elements 12-2, 12-3, 12-4, and 12-5. On the lower surface, indicated by dashed lines, are the ground or reference element 12-6 for the single resonator and reference elements 12-7 to 12-10 for the filter. Each conductive area comprises three portions; an electrode portion which opposes an electrode portion on the other surface, a bonding pad or a pedestal connection area, and a joining link. Under the pedestal connection area of the element 12-6 is a conductive area (not visible) on top of the pedestal 13, and extending down the side of the pedestal to a conductive element 16-6 on the substrate 16 which could also be a printed circuit board. The elements 12-7 to 12-10 contact a second conductive element (not shown) on the pedestal 13, which in turns contacts a second conductive element 16 on the base 16. On the base 16 are other conductive elements 16-3 to 16-7 to which the elements 12-1 to 12-5 are coupled by bonding wires 18. The pedestal 13 may be split, if necessary due to external circuit constraints, with the element which couples 12-6 to 16-6 on one portion, and the element which couples 12-7, etc. to 16-7 on another portion.

In the embodiment shown, the opposing electrodes of conductive elements 12-1 and 12-6 with the crystal area between form a resonator, with the energy trapped between the electrodes. Likewise, the opposing electrodes of conductive elements 12-2 to 12-5 and 12-7 to 12-10 respectively form a filter network operating at a frequency near but distinct from the oscillator frequency. All sections may, if required, operate at the same frequency. The filter sections are acoustically coupled through the crystal. It should be understood that the specific arrangement of conductive elements shown herein is exemplary only and that the invention is not limited thereto.

FIGS. 2-5 show the pedestal mounting structure and the sequence of steps in the bonding process for coupling an element on the edge of the crystal to one on the base. In these figures is seen the substrate 16 with element 16-3, pedestal 13, crystal plate 10 with elements 12-3 and 12-8, bonding wire 18, and a portion of a bonding tool 24. The bonding tool may be of any design which will preform satisfactorily. Such tools typically carry a reel of extremely fine wire of aliminum or gold, feed out wire, supersonically bond one end, feed out more wire, make a second bond, then break or cut off the surplus wire.

Figure 2:
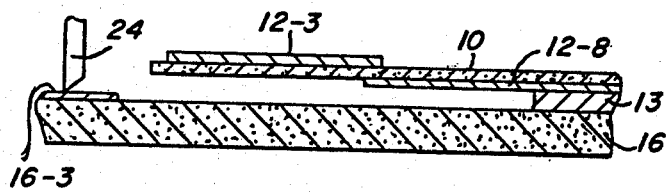
FIGS. 2-5 show the sequence of steps in the wire bonding process.
Figure 3:
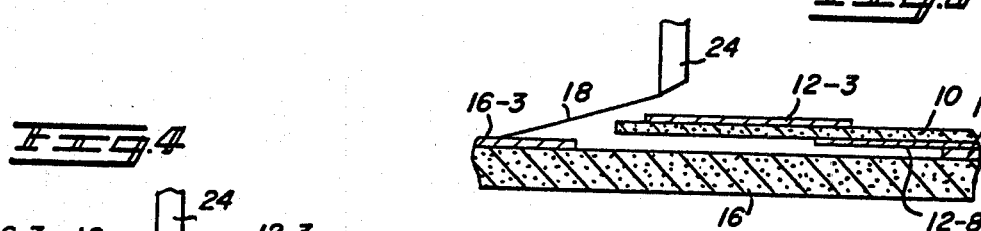
Figure 4:
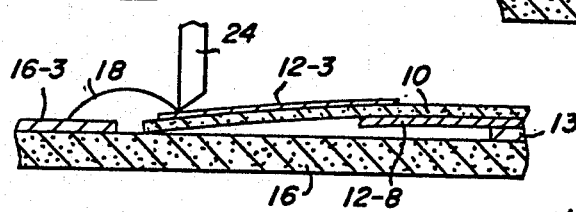
Figure 5:
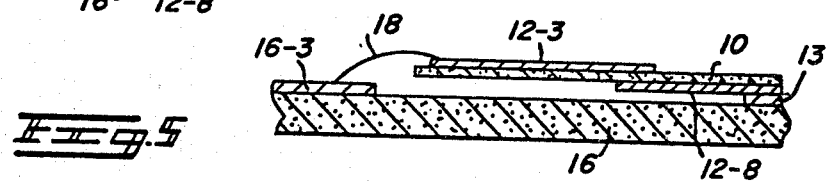

In FIG. 2 the tool 24 is making the wire bond on the element 16-3. The bonds are preferably made by the process commonly known as ultrasonic "scrubbing". In FIG. 3, the bond to element 16-2 has been completed, and the tool 24 is feeding out wire 18 as it moves to a position over the element 12-3. In the normal procedure, the bonding tool will lift from the first bonding site, then come down firmly on the second site, leaving an "arch" of wire to reduce mechanical coupling through the wire. In FIG. 4 the tool 24 has touched the element 12-3 on the crystal plate 10 and gently (20 gms. pressure) pressed the edge of the plate down to touch the substrate 16, then bonded the wire 20 to the element 12-3. As the tool lifts it removes surplus wire as is known in the art. The crystal is then allowed to return to its planar or undeformed shape, as shown in FIG. 5. FIGS. 2-5 demonstrate the steps necessary according to the method of the invention for making wire bonds to the crystal plate 10 while the site of the bonding is depressed enough to be supported by the base, then allowing the plate to resume the planar form when the bond is complete. With proper dimensioning of the pedestal 13, the crystal plate 10 is depressed during bonding with no damage to the plate.

Thus there has been shown and described an arrangement and method for mounting a crystal and making multiple electrical connections thereto. The invention provides for safe wire bonding procedures with the edge portion of the crystal supported only during bonding, but then allows the crystal to assume a position with only the central area supported or "damped". Many variations and modifications of the invention are possible and it is intended to include all such as fall within the spirit and scope of the appended claims.

What is claimed is:

1. A method of supporting and making connections to a crystal plate as for use in an electronic device and comprising the steps of:
   providing an insulating base member;
   forming on said base member a plurality of conductive areas;
   attaching a low insulating pedestal to said base member;
   forming at least one conductive area extending from the upper surface of said pedestal and along a portion of the side of said pedestal to contact respective ones of the conductive areas on the base member;
   providing a crystal plate and conductive areas on said plate, a first area being formed on a first surface of the plate, and others of said areas being formed on a second surface and extending toward the edge of said plate each pair of areas having opposed, active portions;
   fixedly attaching said plate to said pedestal with said first conductive area on said plate making electrical contact with said conductive area on said pedestal;
   wire bonding one end of each of a plurality of wires to respective ones of said conductive areas on said base member;
   bending down respective edge portions of said plate to mechanically contact said base member;
   making a wire bond with the other end of each of said wires to respective ones of said conductive areas on the second surface of said crystal plate while the plate is supported by the base member; and
   releasing the pressure on said plate to allow the plate to resume planar form.

2. A method in accordance with claim 8 wherein the step of bending the edge portions of the plate is performed by the wire bonding tool.

3. A method in accordance with claim 8 wherein the step of making wire bonds is an ultrasonic scrubbing process.

* * * * *